United States Patent
Lee et al.

(10) Patent No.: US 7,078,298 B2
(45) Date of Patent: Jul. 18, 2006

(54) SILICON-ON-NOTHING FABRICATION PROCESS

(75) Inventors: Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 13 days.

(21) Appl. No.: 10/441,674

(22) Filed: May 20, 2003

(65) Prior Publication Data
US 2004/0235262 A1  Nov. 25, 2004

(51) Int. Cl.
*H01L 21/336* (2006.01)

(52) U.S. Cl. .............................. 438/285; 257/E21.414
(58) Field of Classification Search ................ 438/197, 438/214, 221, 226, 263, 264, 269, 274, 280, 438/284, 285, 421, 422, 154, 275, 283, 588, 438/493, 494, 142, 424, 738; 257/49, 66, 257/E21.414, E21.415, E21.564
See application file for complete search history.

(56) References Cited

U.S. PATENT DOCUMENTS

| | | | |
|---|---|---|---|
| 6,274,421 B1 | 8/2001 | Hsu et al. | |
| 6,352,899 B1 | 3/2002 | Sakiyama et al. | |
| 6,368,960 B1 | 4/2002 | Hsu et al. | |
| 6,472,266 B1 | 10/2002 | Yu et al. | |
| 6,486,025 B1 | 11/2002 | Liu et al. | |
| 6,501,120 B1 | 12/2002 | Tu et al. | |
| 6,713,356 B1 * | 3/2004 | Skotnicki et al. | 438/285 |
| 6,727,186 B1 * | 4/2004 | Skotnicki et al. | 438/734 |

FOREIGN PATENT DOCUMENTS

| | | | |
|---|---|---|---|
| FR | 2799307 | * | 4/2001 |
| WO | WO 57480 | * | 9/2000 |
| WO | WO 0057480 | * | 9/2000 |

OTHER PUBLICATIONS

Robert Chau, Jack Kavalieros, Brian Doyle, Anand Murthy, Nancy Paulsen, Daniel Lionberger, Douglas Barlage, Reza Arghavani, Brian Roberds, Mark Doczy, "a 50nm depleted-substrate CMOS transistor (DST)", IEDM, p. 621, 2001.

Risho Koh, "Buried layer engineering to reduce the Drain-Induced Barrier Lowering of sub-0.05 μm SOI-MOSFET", Japanese Journal of Applied Physics, vol. 38 (1999) pp. 2294-2299, Part 1, No. 4B, Apr. 1999.

(Continued)

*Primary Examiner*—Brook Kebede
(74) *Attorney, Agent, or Firm*—Law Office of Gerald Maliszewski; Gerald Maliszewski

(57) ABSTRACT

A method to fabricate a silicon-on-nothing device on a silicon substrate is provided. The disclosed silicon-on-nothing device is fabricated on an isolated floating silicon active area, thus completely isolated from the silicon substrate by an air gap. The isolated floating silicon active area is fabricated on a silicon germanium layer with a surrounding isolation trench. A plurality of anchors is then fabricated to anchor the silicon active area to the silicon substrate before selectively etching the silicon germanium layer to form the air gap. Isolation trench fill and planarization complete the formation of the isolated floating silicon active area. The silicon-on-nothing device on the isolated floating silicon active area can be polysilicon gate or metal gate and with or without raised source and drain regions.

21 Claims, 12 Drawing Sheets

OTHER PUBLICATIONS

Malgorzata Jurczak, Thomas Skotnicki, M. Paoli, B. Tormen, J. Martins, Jorge Luis Regolini, Didier Dutartre, Pascal Ribot, D. Lenoble, Roland Pantel, Stephanie Monfray, "Silicon-On-Nothing (SON)—an innovative process for advanced CMOS", IEEE Transactions on Electron Devices, vol. 47, No. 11, Nov. 2000, pp. 2179-2187.

S. Monfray, T. Skotnicki, Y. Morand, S. Descombes, M. Paoli, P. Ribot, A. Talbot, D. Dutartre, F. Leverd, Y. Lefriec, R. Pantel, M. Haond, D. Renaud, M-E. Nier, C. Vizioz, D. Louis, N. Buffett, "First 80nm SON (Silicon-On-Nothing) MOSFETs with perfect morphology and high electrical performance", IEDM, 2001.

Tsutomu Sato, Hideaki Nii, Masayuki Hatano, Keiichi Takenaka, Hisataka Hayashi, Kazutaka Ishigo, Tomoyuki Hirano, Kayuhiko Ida, Nobutoshi Aoki, Tatsuya Ohguro, Kazumi Ino, Ichiro Mizushima, Yoshitaka Tsunashima, "SON (Silicon-On-Nothing) MOSFET using ESS (Empty Space in Silicon) technique for SoC applications", IEDM Tech. Digest, p. 809, 2001.

Ichiro Mizushima, Tsutomu Sato, Yoshitaka Tsunashima, "SON (Silicon-On-Nothing) MOSFET using ESS (Empty Space in Silicon) technique", Electrochemical Society International Semiconductor Technology Conference 2002, Sep. 12, 2002, Tokyo, Japan.

* cited by examiner

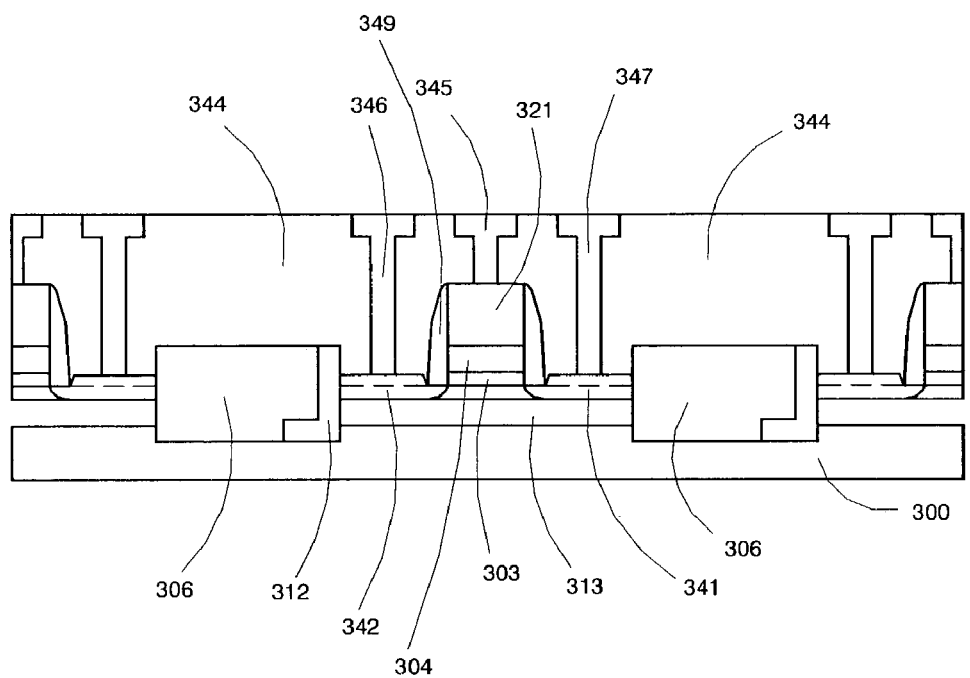
Fig. 7P
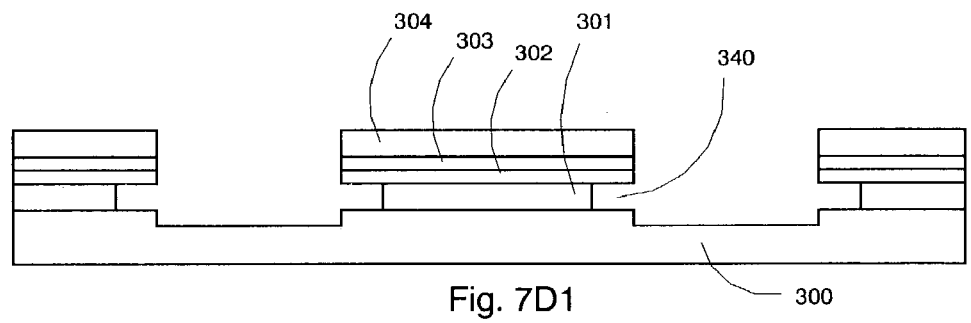
Fig. 7D1

SILICON-ON-NOTHING FABRICATION PROCESS

FIELD OF THE INVENTION

This invention relates to the fabrication of semiconductor devices and silicon-on-insulator (SOI) devices, and specifically to a method for fabricating silicon-on-nothing devices.

BACKGROUND OF THE INVENTION

MOSFET fabricated on Silicon-On-Insulator (SOI) substrate has significant advantages such as higher speed, lower power and higher density than on bulk silicon wafer substrate. SOI substrate consists of a thin surface layer of single crystal silicon on an underlayer of insulating material on a bulk silicon wafer. The thin surface silicon layer, typically a few tens of nanometers to several microns thick, is the silicon channel of the transistor. The insulating layer, usually made of silicon dioxide, is referred to as the buried oxide and is usually a few hundreds of nanometers thick.

SOI wafers improve the transistor performance by reducing the operating silicon volume and by isolating the transistors. The thin surface silicon layer limits the volume of silicon that needs to be charged to switch the transistor on and off, and therefore reduces the parasitic capacitance of the transistor and increases the switching speed. The insulating layer isolates the transistor from its neighbors, and therefore reduces the leakage current and allows the transistor to operate at lower supply voltages and thus the transistors can be smaller and more densely packed.

For CMOS technology in the sub-50 nm, the silicon channel and the buried oxide thickness need to be much less than 50 nm and 100 nm, respectively, in order to prevent short channel effect. A super SOI with silicon film thickness of 5 nm and buried oxide thickness of 20 nm may be capable of suppressing short channel effect at the CMOS down scaling limit of 20 nm channel length. However, these requirements on the thickness of the silicon and buried oxide films exceed the present manufacturing capabilities of SOI wafers. Furthermore, the device performance can be improved with an insulator having lower dielectric constant, which cannot be achieved with a buried oxide. The lowest dielectric constant for the insulator layer is 1, meaning an air gap under the silicon layer, and the improved device is called silicon-on-nothing (SON) device. SON device simulation on theoretically proposed device shows improved performance over SOI device with buried oxide having a dielectric constant of 3.9 (see R. Koh, "*Buried layer engineering to reduce the drain-induced barrier lowering of sub*-0.05 $\mu m$ *SOI-MOSFET*", Japanese Journal of Applied Physics, Vol. 38 (1999), pp. 2294–2299, Part 1, No. 4B, April 1999).

Various SON device fabrication processes have been proposed with the source and drain areas connected to the substrate. Though these devices show improved performances, their device structures could lead to higher parasitic source and drain capacitance, together with a potential concern of subsurface punch through. For examples, see M. Jurczak, T. Skotnicki, M. Paoli, B. Tormen, J. Martins, J. L. Regolini, D. Dutartre, P. Ribot, D. Lenoble, R. Pantel, S. Monfray, "*Silicon-on-nothing (SON)—an innovative process for advanced CMOS*", IEEE Transactions on Electron Devices, Vol. 47, No. 11, November 2000, pp. 2179–2187;

S. Monfray, T. Skotnicki, Y. Morand, S. Descombes, M. Paoli, P. Ribot, A. Talbot, D. Dutartre, F. Leverd, Y. Lefriec, R. Pantel, M. Haond, D. Renaud, M-E. Nier, C. Vizioz, D. Louis, N. Buffet, "*First 80 nm SON (silicon-on-nothing) MOSFETs with perfect morphology and high electrical performance*", IEDM Tech. Dig., 2001, p. 800; and T. Sato, H. Nii, M. Hatano, K. Takenaka, H. Hayashi, K. Ishigo, T. Hirano, K. Ida, N. Aoki, T. Ohguro, K. Ino, I. Mizushima, Y. Tsunashima, "*SON (silicon-on-nothing) MOSET using ESS (empty space in silicon) technique for SoC application*", IEDM Tech. Dig., 2001, p. 809.

Shown in FIG. 1A is the prior art SON device comprising a gate electrode 8, a gate dielectric 7, source 4, and drain 5 through the device channel 6, together with the source and drain extensions 4*a* and 5*a* on a silicon substrate 1. The SON device is isolated by trench isolation 3 and floated on an air gap 2. However, the air gap 2 is limited to the device channel 6 and the source and drain extensions 4*a* and 5*a*. The source 4 and drain 5 are still connected to the silicon substrate 1. FIG. 1B shows the top view of the prior art SON device.

SUMMARY OF THE INVENTION

The present invention provides a method to fabricate silicon-on-nothing (SON) devices with the source, drain and channel areas isolated from the silicon substrate by an air gap. The SON MOSFET device, including source, drain and channel areas, is fabricated on an isolated floating silicon active area. The isolated floating silicon active area is completely isolated from other active silicon areas by trench isolation surrounding the silicon active area and is isolated from the silicon substrate by an air gap.

In one aspect of the invention, the fabrication process of an isolated floating active area on a semiconductor substrate is disclosed. A multilayer comprising a cap layer and a sacrificial layer is deposited on a semiconductor substrate. The multilayer is then patterned into an active area by etching selected areas of the multilayer. The etched areas surrounding the active area define an isolation trench to isolate the active area. The etched isolation trench has a depth at or below the sacrificial layer, and preferably below the sacrificial layer. A plurality of anchors, connecting the isolated active area to the substrate, is then formed to anchor the active area before etching away the sacrificial layer. The isolation trench can be filled and the structure can be planarized to form an isolated floating active area.

In other aspect of the invention, the present invention discloses the fabrication process for an isolated floating silicon active area on a silicon substrate. The multilayer preferably further comprises a gate dielectric and a cap layer. The silicon active area is preferably a multilayer of epitaxial silicon, gate dielectric and cap layer, deposited on a sacrificial layer of epitaxial silicon germanium. The fabrication process of the isolated floating silicon active area starts with a multilayer of silicon germanium and a silicon layer. The multilayer preferably further comprises a gate dielectric and a cap layer. Then the silicon active area is formed by etching selected areas of the multilayer structure surrounding the silicon active area. The etching defines an isolation trench around the silicon active area. The isolation trench depth is at least at or below the silicon germanium layer. The isolation trench depth is preferably 5 nm to 50 nm below the silicon germanium layer. A plurality of anchors is then fabricated to anchor the silicon active area to the silicon substrate before selectively etching the silicon germanium layer. The isolation trench then can be filled and planarized. The floating silicon active area is now supported by the surrounding trench isolation.

In a variation of the above process sequence, a partial etching of the silicon germanium layer can be performed before the formation of the anchor. Furthermore, a thermal oxidation step can be inserted after the selective etching of the silicon germanium layer. The thermal oxidation step can oxidize the exposed silicon surfaces: the bottom surface of the epitaxial silicon, and the top surface of the silicon substrate. These silicon surfaces are exposed after the selective etching of the silicon germanium layer. The thermal oxidation step can partially or fully filled the air gap formed by the selective etching of the silicon germanium layer with thermally grown silicon dioxide.

The silicon layer is preferably epitaxial silicon with a thickness preferably between 3 nm and 100 nm. The silicon germanium layer is preferably epitaxial silicon germanium with thickness preferably between 3 nm and 500 nm, and most preferably between 3 nm and 50 nm. The germanium content in silicon germanium layer is preferably between 10% to 70%, and most preferably between 20% and 60% to provide good etch selectivity and good epitaxial growth conditions for the epitaxial silicon layer. The gate dielectric layer is preferably deposited or grown silicon dioxide, and most preferably high k dielectric material such as hafnium oxide, zirconium oxide, aluminum oxide, hafnium silicate, or any combination thereof. The cap layer is preferably polysilicon layer for polysilicon gate devices, or polysilicon, silicon dioxide or silicon nitride for metal gate devices.

The patterning step of the active area and the anchors is preferably by photolithography where a photo resist is coated and exposed to UV light under a photo mask to transfer a pattern from the photo mask onto the photo resist. The photo resist protects the substrate during an etch step to transfer the pattern from the photo resist onto the substrate. And then the photo resist can be stripped. The pattern transfer etching is preferably accomplished by reactive ion etching or by wet etches.

The isolation trench etch depth is preferably below the silicon germanium layer, and most preferably between 5 nm and 50 nm below the silicon germanium layer.

The anchor formation is preferably by photolithography after the deposition of an anchor layer. An anchor pattern is transferred to a photo resist coating and an etch step can transfer the anchor pattern to the anchor layer. The anchor layer is preferably an insulated material such as silicon dioxide or silicon nitride. The anchor supports the silicon active area while providing adequate access to the silicon germanium so that the silicon germanium can be etched to form an air gap under the silicon active area. The silicon germanium etching is preferably accomplished by reactive ion etching or by wet etch using selective etch solution such as $NH_4OH/H_2O_2/H_2O$.

In another aspect of the invention, the present invention discloses the fabrication process of a SON device on an isolated floating silicon active area. The SON device is completely isolated from its neighboring SON devices by the surrounding isolation trench and by the air gap under the silicon active area. The air gap isolation of the source, drain and channel areas of the SON device offers high performance device.

In the SON device fabrication process, the silicon active area is preferably a multilayer of epitaxial silicon, gate dielectric and cap layer, deposited on a layer of epitaxial silicon germanium. The epitaxial silicon layer is preferably implanted with doping impurities to adjust the threshold voltage. After the completion of the isolated floating silicon active area, state of the art transistor fabrication process can be performed to create SON devices.

The SON device can be polysilicon gate device or metal gate device. Raised source and drain can be fabricated.

BRIEF DESCRIPTION OF THE DRAWINGS

FIGS. 7A–7P show the fabrication steps for the present invention SON device.

FIG. 7D1 shows a variation of the fabrication steps.

DETAILED DESCRIPTION OF THE INVENTION

The present invention discloses a method to fabricate an isolated floating active area on a semiconductor substrate. The isolated floating active area is isolated by trench isolation surrounding the active area and is floated on an air gap. The air gap is made from a sacrificial material and then selectively etched. To prevent the active area from being lift off when the sacrificial layer is removed, a plurality of anchors holding the active area to the substrate is fabricated before the selective etching step. The anchors can then be merged with the isolation material in later step.

Figure 2A:
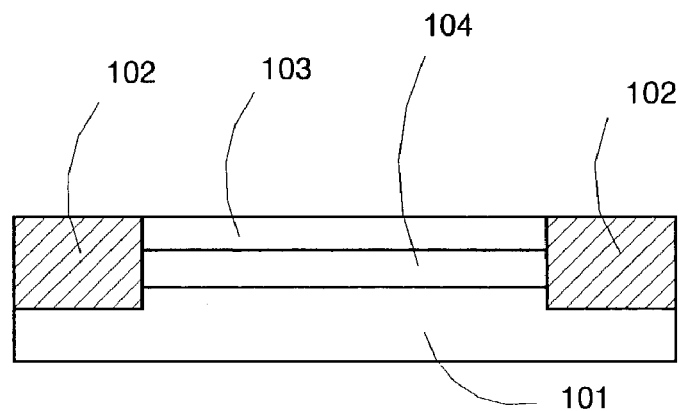
FIGS. 2A and 2B show the present invention isolated floating active area.
Figure 2B:
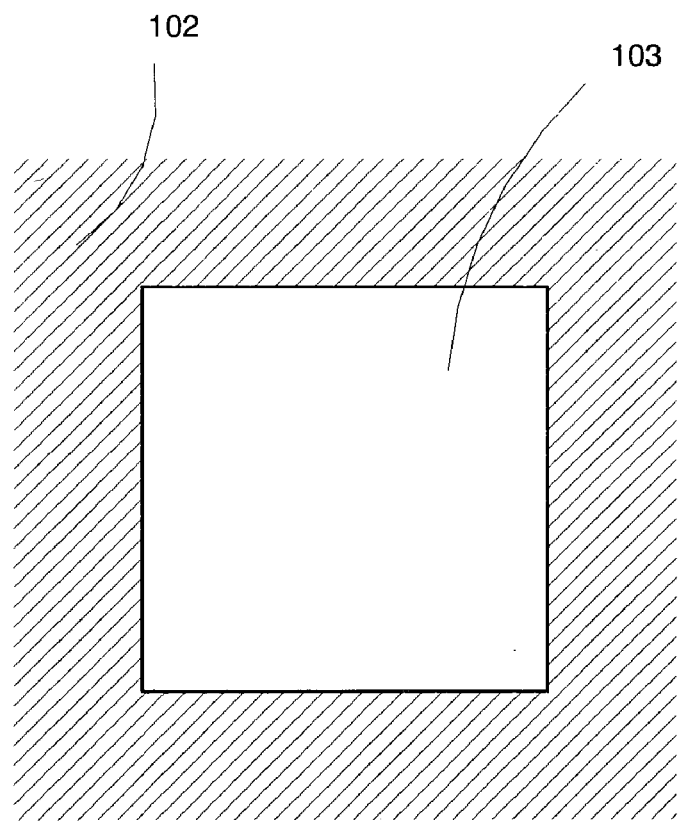

FIG. 2A shows the present invention of an isolated floating active area 103 on a semiconductor substrate 101. The isolated floating active area 103 is isolated by a filled trench isolation 102 surrounding the active area 103 and is isolated from the semiconductor substrate 101 by an air gap 104. The floating active area 103 is supported by the filled trench isolation 102. FIG. 2B shows the top view of the isolated floating active area 103, surrounding by the trench isolation 102.

Figure 3A:
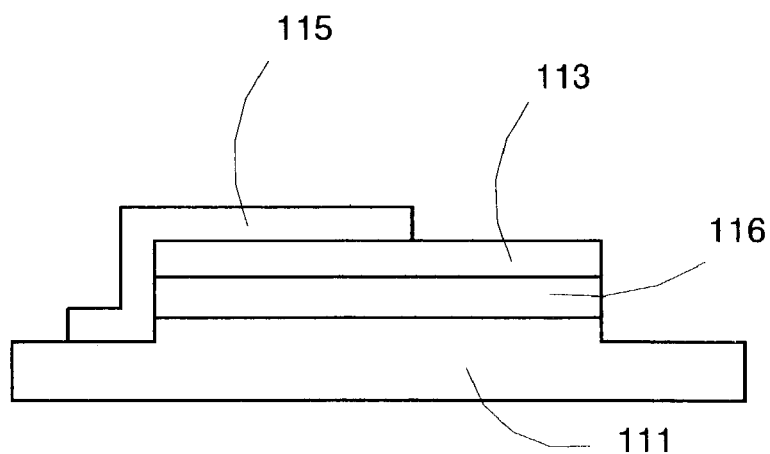
FIGS. 3A and 3B show the present invention anchor structure supporting the active area.
Figure 3B:
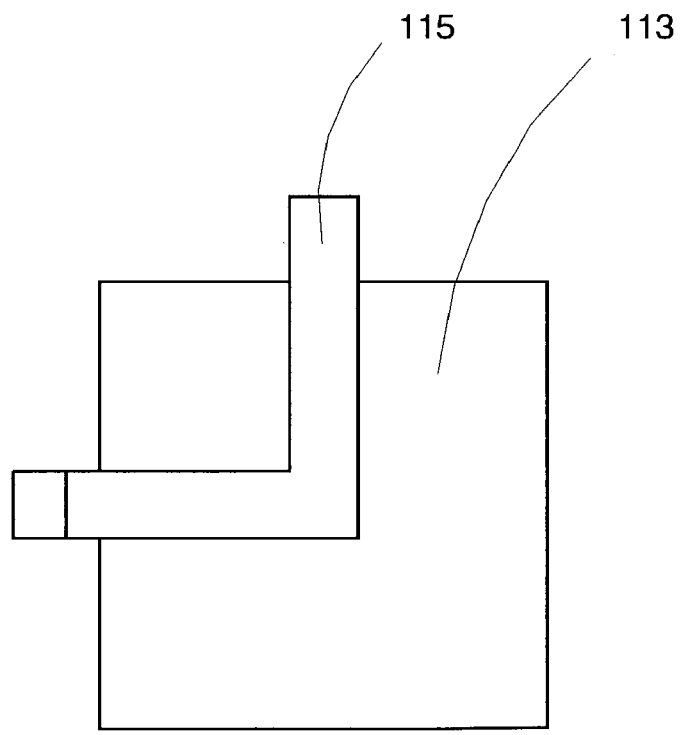

FIG. 3A shows the isolated floating active area structure having an anchor 115 supporting the active area 113 before etching the sacrificial layer 116. In this figure, the trench isolation 112 is not yet filled, and therefore the active area 113 is supported by the anchor 115. FIG. 3B shows the top view of the active area 113 together with the supporting anchor 115. The anchor 115 is designed to provide minimum blockage and to optimize the etching of the sacrificial layer 116 by providing maximum access to the sacrificial layer.

Figure 4A:
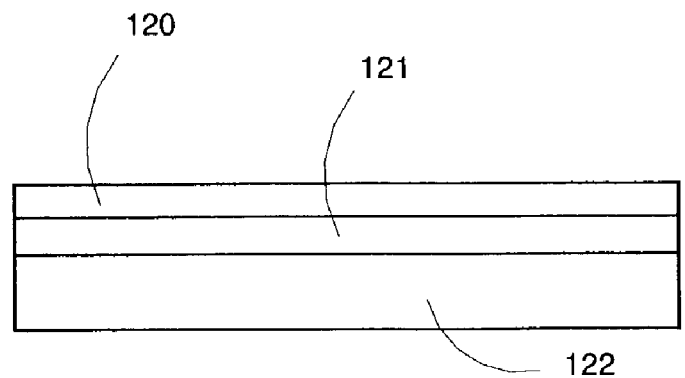
FIGS. 4A–4F show the complete fabrication steps for the isolated floating active area.
Figure 4B:
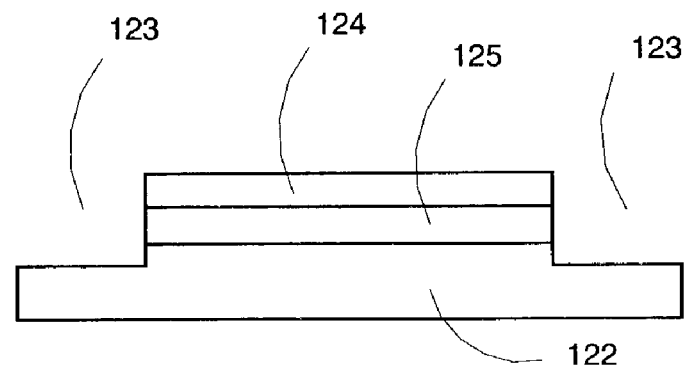
Figure 4C:
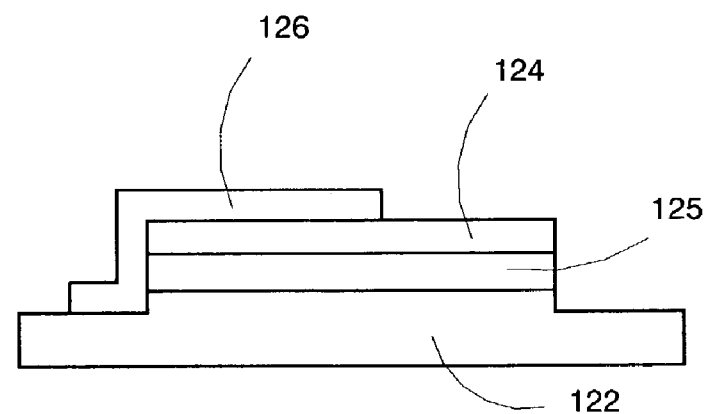
Figure 4D:
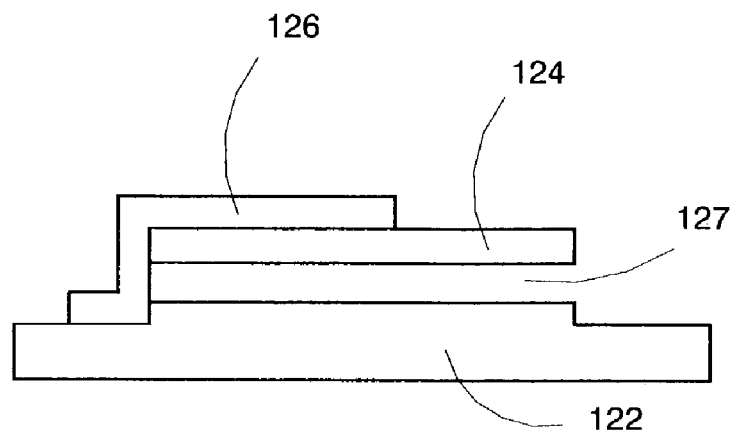
Figure 4E:
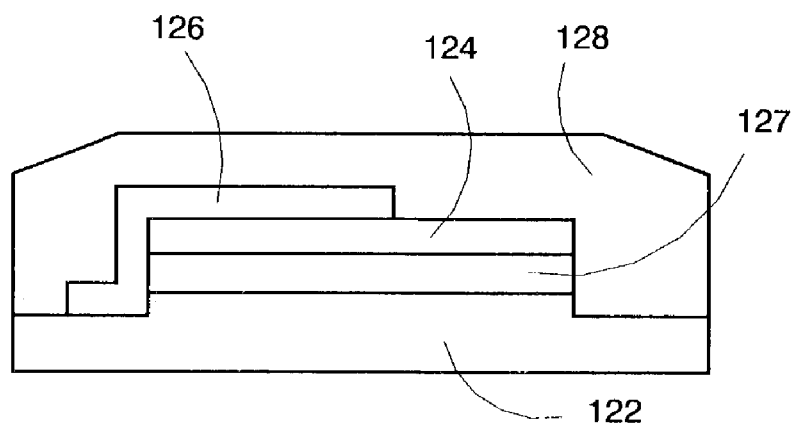
Figure 4F:
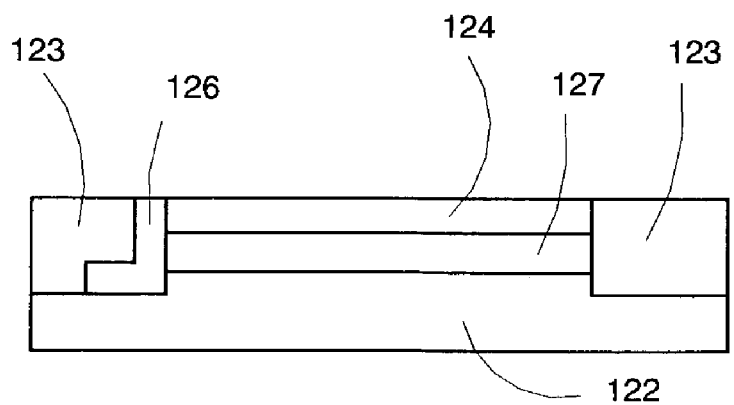

FIGS. 4A–F show the complete fabrication step for the present invention isolated floating active area. A multilayer structure comprising an active layer 120 and a sacrificial layer 121 is deposited on a semiconductor substrate 122 as shown in FIG. 4A. The active area 124 is then formed by etching an isolation trench 123 around the active area as shown in FIG. 4B. The etched isolation trench 123 exposes most of the sacrificial area 125, and preferably exposes the entire sacrificial area 125 and also some of the substrate 122 as shown in this figure. An anchor 126 is fabricated on the isolated floating active area, connecting the isolated floating active area 124 with the exposed substrate 122 as shown in FIG. 4C. Then the sacrificial area 125 is selectively etched away to form the air gap 127, leaving the isolated floating active area 124 supported by the anchor 126, as shown in FIG. 4D. A filled layer 128 is deposited on the whole structure to fill the isolation trench 123 as shown in FIG. 4E. The isolation trench fill is preferably filling completely the isolation trench 123 and not filling completely the air gap 127, and more preferably has minimum filling of the air gap 127 to maximize the size of the air gap. Then the filled layer 128 is planarized using a global planarization process such as a chemical mechanical polishing (CMP), stopping on the active area 124 as shown in FIG. 4F. The isolated floating active area 124 is floated on the air gap 127, surroundedly isolated by the trench isolation 123 and isolated from the substrate 122 also by the air gap 127. The isolate floating active area 124 is now supported by the filled trench isolation 123, together with the remnant of the anchor 126 after the CMP step. The remnant of the anchor 126 can be merged with the trench isolation 123 if both are of the same material.

FIGS. 2A, 3A, and 4F show only one layer of the isolated floating active area, but the use of multiple layers is also within the scope of the current invention. If the isolated floating active area is very thin or not structurally stable, additional layers may be deposited on the isolated floating active area layer to improve its strength. Also layers of subsequent process steps can be deposited before the formation of the isolated floating active area to optimize the process flow.

Figure 1A:
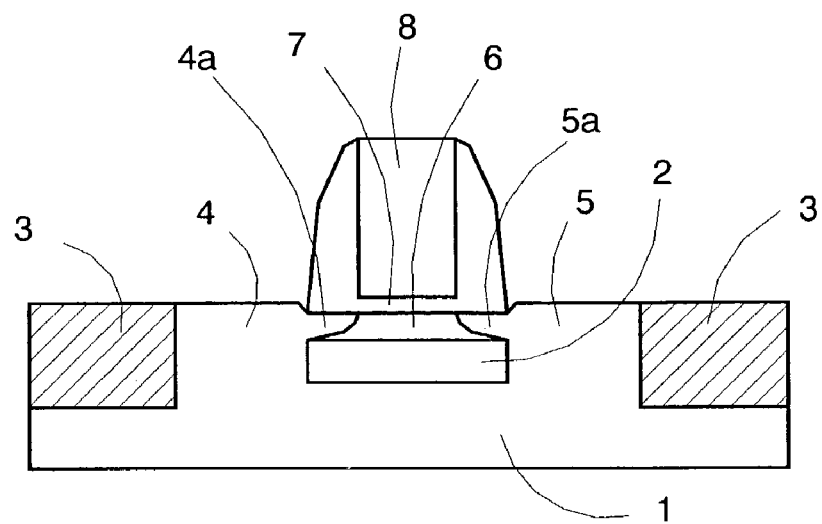
FIGS. 1A and 1B show the prior art SON device.
Figure 1B:
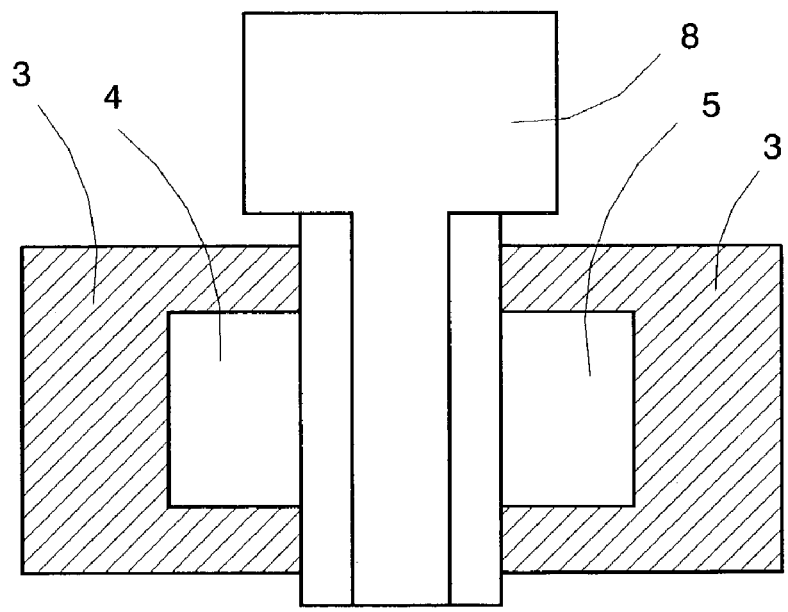

In a variation of the disclosed isolated floating active area fabrication process, the steps in FIGS. 4C1 and 4C2 can replace FIG. 4C. FIG. 4C1 shows an additional step of partially etching the sacrificial area, inserted before the formation of the anchor. A fraction 130 of the sacrificial area 125 is etched, leaving enough of the remaining sacrificial area 125 to support the floating area 124. With this variation of the process, the anchor formation process in FIG. 4C will show in FIG. 4C2 where the anchor 126 attaches to the floating area 124 and the substrate 122 with an air gap 130 in the sacrificial area. The process conditions of the deposition of the anchor material are such that the gap 130 is not filled. This process variation improves the etching of the sacrificial layer during the formation of the air gap.

Figure 5A:
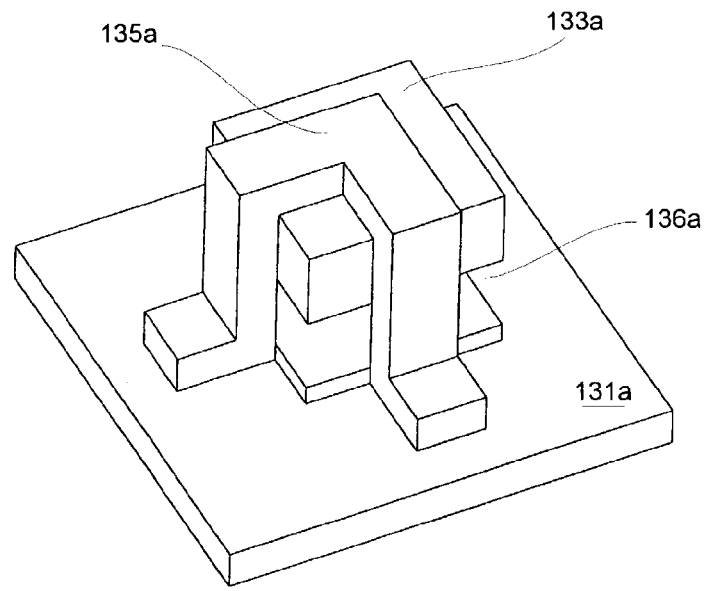
FIGS. 5A–5D show the various variations of the anchor structure.
Figure 5B:
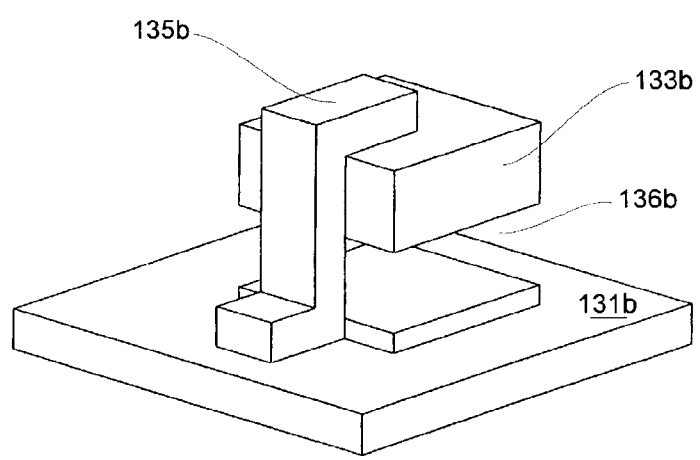
Figure 5C:
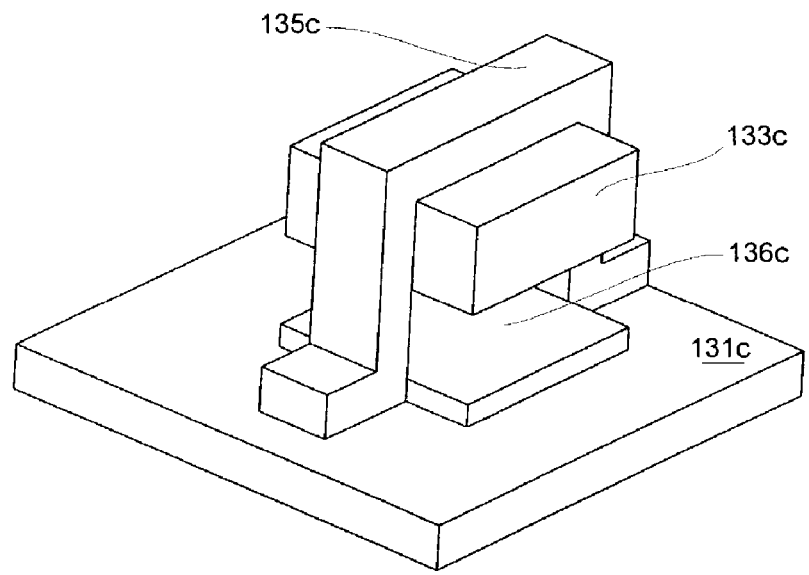
Figure 5D:
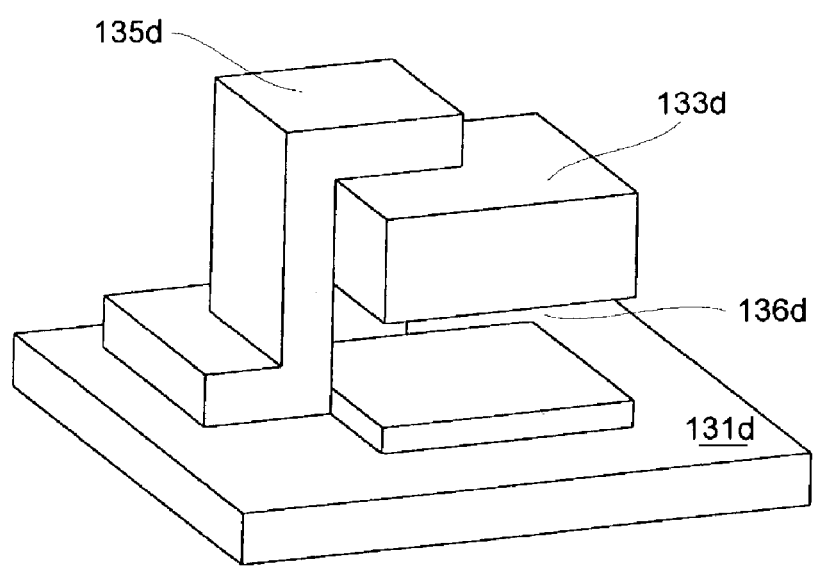

Various embodiments of the anchor formation are disclosed in FIGS. 5A–5D. FIG. 5A shows two anchors 135a supporting two sides of the floating active area 133a on the air gap 136a to the substrate 131a. FIG. 5B shows one anchor 135b supporting only one side of the floating active area 133b on the air gap 136b to the substrate 131b. FIG. 5C shows two anchors 135c supporting two opposite sides of the floating active area 133c on the air gap 136c to the substrate 131c. FIG. 5D shows one large anchor 135d supporting two sides of the floating active area 133d on the air gap 136d to the substrate 131d. It will be appreciated that further variations and modifications of the anchor structures may be made with the anchors supporting the floating active area without blocking all of the sacrificial layer opening.

Figure 6:
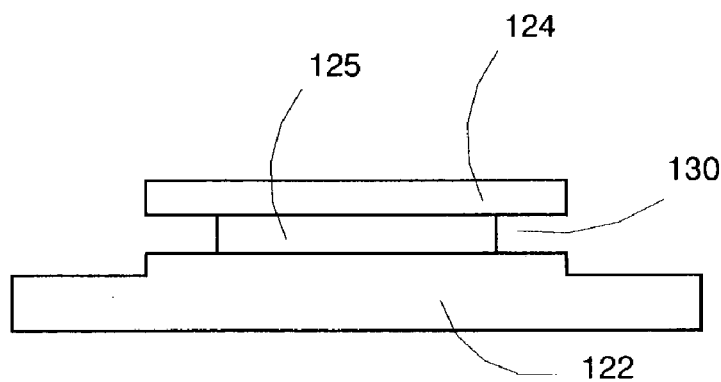
FIG. 6 shows the present invention isolated floating silicon active area.
Figure 6:
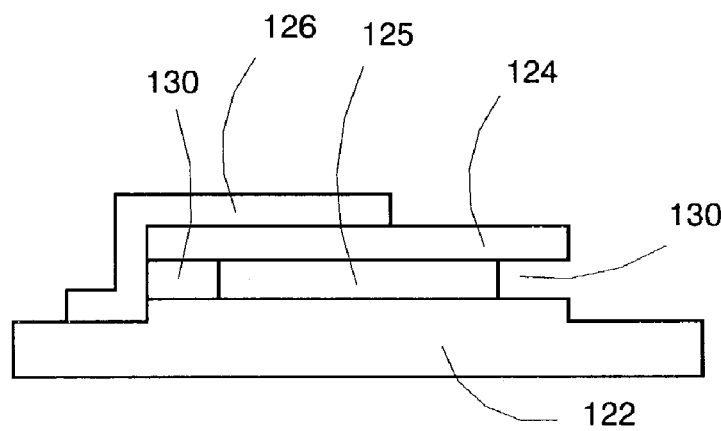
Figure 6:
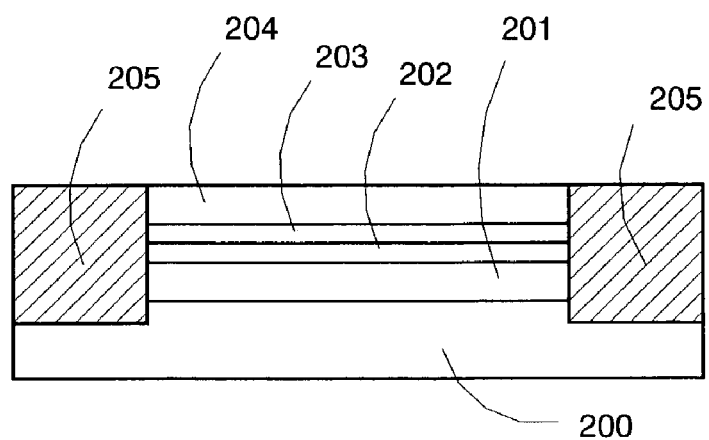

A preferred embodiment of the present invention is the fabrication of an isolated floating silicon active area as shown in FIG. 6. The isolated floating silicon active area, comprising an epitaxial layer of silicon layer 202, a gate dielectric layer 203 and a cap layer 204, is surroundedly isolated by a trench isolation 205 and is isolated from the silicon substrate 200 by an air gap 201. The epitaxial silicon layer 202 can be implanted to adjust the device threshold voltage. The cap layer can be a polysilicon layer for the fabrication of gate polysilicon device, or a polysilicon, silicon dioxide or silicon nitride as CMP stopping layer in the fabrication of metal gate device.

The fabrication process of the present invention isolated floating silicon active area is described as followed. Starting with a silicon wafer substrate, a layer of silicon germanium is epitaxially deposited, followed by an epitaxial layer of silicon wherein the thickness of the silicon layer is preferably between 3 nm to 100 nm. In some aspect of the invention, subsequent layers such as gate dielectric layer, gate polysilicon layer, cap layer, are also deposited on the silicon layer. If the silicon layer is very thin and therefore is not structurally stable, additional layers may be deposited on the silicon layer to improve its strength. Also, subsequent process steps can be applied right after the silicon layer deposition instead of waiting for the completion of the formation of silicon active area to prevent contamination, to improve surface cleanliness and to optimize process flow. An ion implantation step to adjust the threshold voltage can be performed after the epitaxial silicon deposition step. For polysilicon gate device, a gate dielectric layer and a gate polysilicon layer can be deposited on the epitaxial silicon layer. For metal gate device, a gate dielectric and a CMP stopping layer such as polysilicon, silicon dioxide or silicon nitride can be deposited. The CMP stopping layer is used for planarization stopping during global planarization step such as a chemical mechanical polishing (CMP) step.

The layer of silicon germanium is chosen as a sacrificial layer because silicon germanium can be etched selectively with respected to silicon to form an air gap for the floating silicon layer. For device applications, silicon germanium has a further advantage of lattice matching with silicon, leading to the ease of the deposition of the epitaxial silicon layer. The germanium content in the silicon germanium layer can be between 10 to 70%, and preferably between 20% and 60%. Low germanium content has less lattice strain and thus easier for epitaxial silicon deposition. High germanium content has better etch selectivity with respect to silicon, and thus easier for air gap formation. Silicon germanium and silicon lattices are slightly different, therefore the deposition of epitaxial silicon germanium on silicon will create strained silicon germanium with a lattice similar to silicon. If the silicon germanium is thicker than a critical thickness, the lattice of the silicon germanium could relax to the equilibrium lattice of silicon germanium, and could create difficulty to the subsequently deposited epitaxial silicon. Therefore the thickness of the silicon germanium is preferably chosen to be less than a critical thickness so that there is no relaxation of the silicon germanium. The thickness of the silicon germanium is preferably between 3 nm to 50 nm.

After the deposition of the multilayer structure, the multilayer structure is then patterned into silicon active area. The preferred process for the patterning step is photolithography, transferring the image from a photo mask to a photo resist coating. In a typical photolithography process, the multilayer is coated with a photo resist layer which is exposed under an UV light with a photo mask, and then developed. Depending on the type of photo resists used, such as negative resist or positive resist, the image from the photo mask is transferred positively or negatively onto the photo resist.

The isolation trench surrounding the silicon active area is then fabricated by etching the patterned silicon active area. The isolation trench exposes at least most of the silicon germanium layer. The isolation trench etch preferably exposes the entire silicon germanium layer plus an overetch amount into the silicon substrate. The silicon substrate overetch can be as shallow as 10 nm deep since the silicon active area is completely isolated, and therefore no deep isolation is needed. The patterned photo resist protects the silicon active area during the isolation trench etching. After the formation of the silicon active area, the photo resist can be stripped.

Before the silicon germanium layer is etched away to form the floating silicon active area, the silicon layer needs to be anchored to the substrate to prevent lift off. A plurality of anchors is then fabricated, connecting the silicon active area to the substrate to support the silicon active area during the subsequent etching of the silicon germanium underlayer. The anchor material is different from silicon germanium to prevent being etched during the etching of the silicon germanium underlayer. The anchor material is preferably an insulating material such as silicon dioxide since the anchor then can be part of the shallow trench isolation material. The anchors are preferably leaving enough opening to the silicon germanium to allow etching access.

The anchors are preferably fabricated as followed: A thin anchor layer of insulating material such as silicon dioxide or silicon nitride is blanketly deposited. The thickness of the anchor layer is preferably between 10 nm to 500 nm. The anchor layer covers both the silicon layer and the substrate. The anchor layer is then patterned, preferably by photolithography step, and then selected portion of the anchor layer is etched away to form a plurality of anchors connecting the silicon layer to the substrate.

After the formation of the anchors, the silicon germanium can be etched away to form the floating silicon active area. The silicon germanium is preferably being etched completely to form the air gap, but could be etched partially to leave a support column of silicon germanium under the silicon active area. The anchors are preferably designed so that the floating silicon active area is properly supported when the silicon germanium is etched away. The etching of silicon germanium is preferably selective against silicon. The mixture of $NH_4OH/H_2O_2/H_2O$ can be used for selective silicon germanium wet etch. A plasma dry etch can also be applied to etch the silicon germanium layer selectively.

An optional step of partially etching of the silicon germanium can be performed before the formation of the anchors. The silicon germanium can be etched partially to recess the silicon germanium with a section of the germanium layer left. The remaining section of silicon germanium in the middle of the active area is used to prevent the lifting of the silicon active area. In this variation, the anchor layer deposition characteristic is preferably not too conformal to prevent the filling of the silicon germanium recess. Plasma enhanced chemical deposition technique is preferred for the deposition of the anchor layer.

Then the isolation trench is filled and planarized. A filled layer, preferably the same material as the anchor layer and preferably an insulating material such as silicon dioxide or silicon nitride, is deposited to fill the isolation trench. The filled layer is preferably filling the isolation trench and not filling the air gap completely. Planarization is then carried out to smooth the surface, stopping on the cap layer. The silicon layer is now floating on top of an air gap, and completely isolated by the isolation trench and the air gap.

Another preferred embodiment of the present invention is the fabrication of silicon-on-nothing (SON) devices with the source and drain areas isolated from the silicon substrate. The disclosed SON device, including the source, drain and gate areas, is fabricated on an isolated floating silicon active area.

Figure 7A:
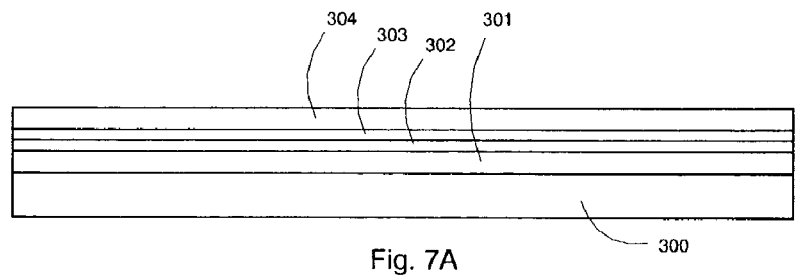

FIG. 7A shows a multilayer semiconductor structure that has been prepared using state of the art processes. The multilayer structure comprises a layer of gate polysilicon 304, a layer of gate dielectric 303, a layer of epitaxial silicon 302, a layer of epitaxial silicon germanium 301 on a silicon wafer substrate 300. The epitaxial silicon germanium layer 301 is grown onto the silicon substrate 300. The thickness of the silicon germanium 301 is preferably less than the critical thickness so that no relaxation occurs. The thickness of the silicon germanium 301 is preferably between 3 nm to 50 nm. The epitaxial silicon layer 302 is grown onto the silicon germanium layer 301. The thickness of the epitaxial silicon layer 302 is preferably between 3 nm to 100 nm. The doping concentration of the epitaxial silicon layer may be modified by a channel ion implantation to adjust the threshold voltage. A gate dielectric layer 303 is grown or deposited on the epitaxial silicon layer 302. The gate dielectric material can be silicon dioxide, and preferably a high k dielectric material such as hafnium oxide or zirconium oxide. Then a gate polysilicon layer 304 is deposited. The polysilicon layer 304 can be used as gate material or simply as a chemical mechanical polishing (CMP) stop layer. If it is for CMP stop layer, it can be replaced by silicon nitride and will be removed after the CMP step, and the gate dielectric and the gate electrode will be deposited after the removal of the CMP stop layer.

Figure 7B:
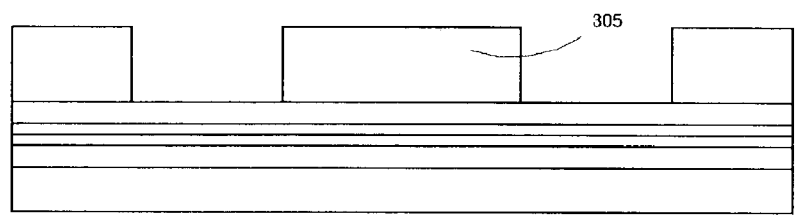

FIG. 7B shows the shallow trench isolation photolithography process to pattern the multilayer structure into silicon active area. The photo resist 305 defines the active area. Depending on the silicon germanium etch rate and the silicon germanium to silicon etch selectivity, it may be preferable to define a maximum dimension of the polygon in the silicon active area layout.

Figure 7C:
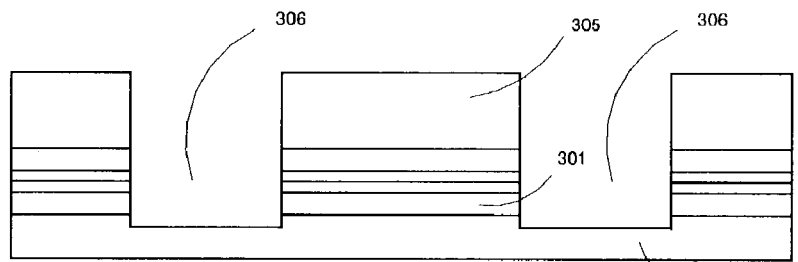
Figure 7D:
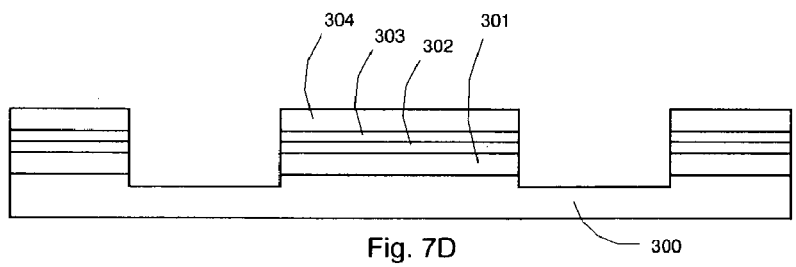

FIG. 7C shows the isolation trench etch 306 surrounding the silicon active area. The photo resist 305 protects the multilayer during the isolation trench etch step, and will be removed after the completion of the isolation trench etch as shown in FIG. 7D. The isolation trench etch depth is preferably a little below the silicon germanium layer 301 with an overetch amount. Since the device will be fabricated on the top epitaxial silicon layer 302, and the silicon germanium 301 will be replaced by air, no deep isolation is needed. The isolation trench overetch may be between 5 nm to 50 nm, and is preferably 10 nm below the silicon germanium layer.

Figure 7E:
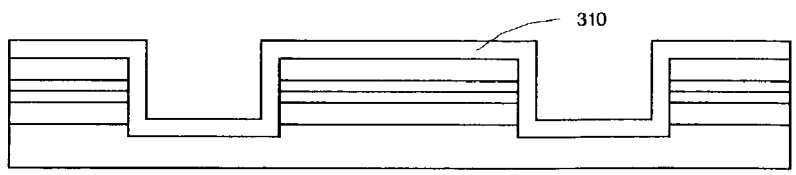
Figure 7F:
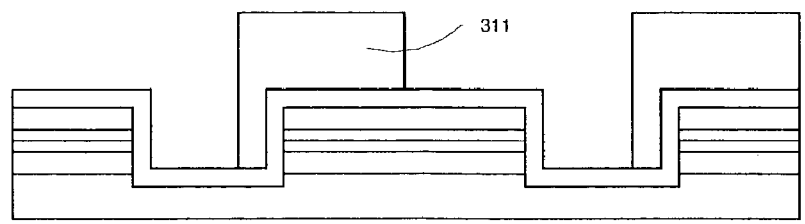

FIG. 7E shows an anchor layer 310, preferably silicon dioxide or silicon nitride, deposited on the active area and the isolation trench. FIG. 7F shows the photolithography step to define the anchor. The photo resist 311 protects the anchor area.

Figure 7G:
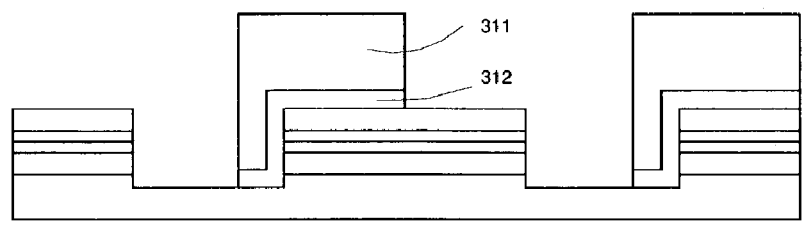
Figure 7H:
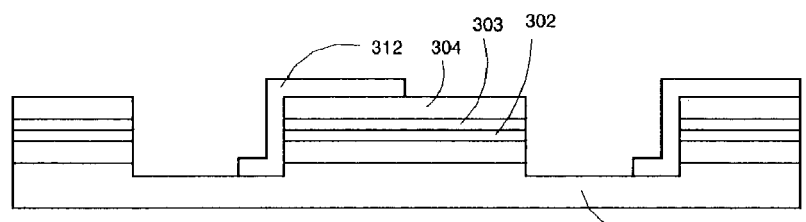

FIG. 7G shows the formation of the anchor 312 after the patterned anchor layer is etched away with the photo resist pattern 311 protecting the anchor structure, and FIG. 7H shows the anchor structure 312 after the photo resist 311 is stripped. The anchor 312 attaches to the top surface of the gate polysilicon layer 304 of the active area, and to the sidewalls of the layers 304, 303, and 302. The anchor also attaches to the surface of the exposed substrate silicon 300. The anchor may also attach to the sidewall of the silicon germanium, but since the silicon germanium will be etched away, the adhesion between the anchor and the sidewall of the silicon germanium is not critical.

Figure 7I:
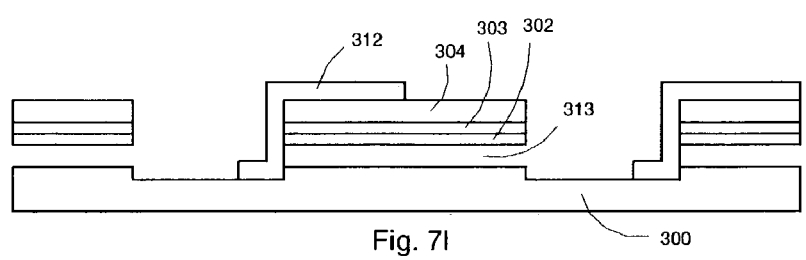

FIG. 7I shows the formation of the air gap 313 after the silicon germanium is etched away. The active areas 304, 303, and 302 are now supported above the air gap 313 by the anchor 312.

Figure 7J:
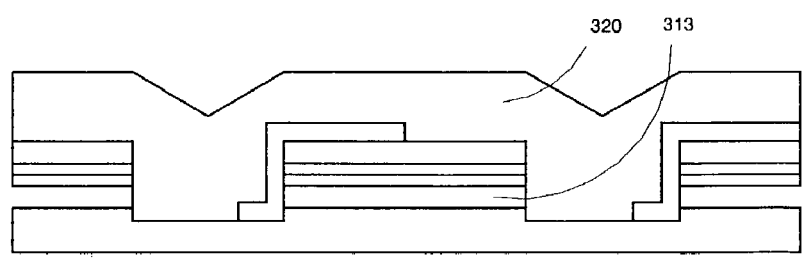
Figure 7K:
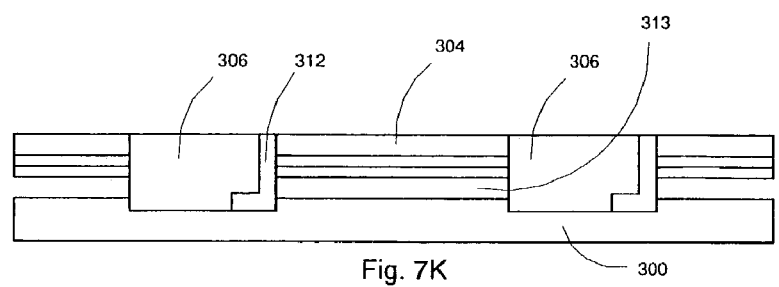

FIG. 7J shows the filling of the isolation trench, preferably filling completely the isolation trench and not the air gap. FIG. 7K shows the planarization step using CMP and stopping on the polysilicon layer 304. The filled isolation trench 306 and the remnant of the anchor 312 now support the silicon active area above the air gap 313.

Figure 7L:
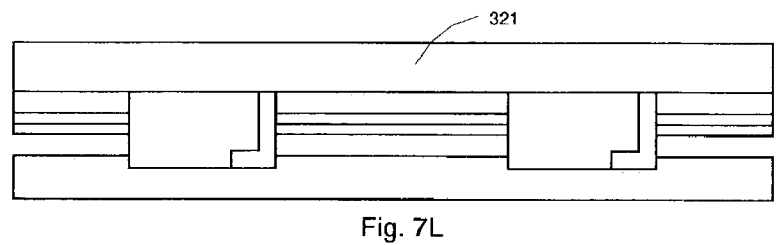
Figure 7M:
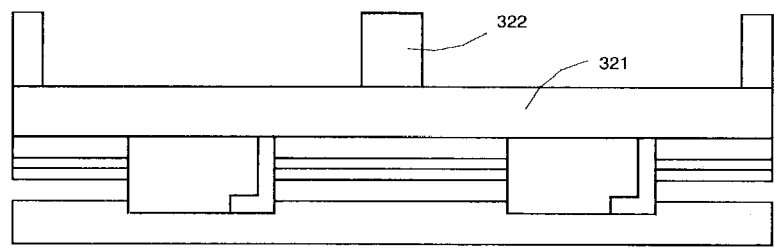

FIG. 7L shows the next optional step of depositing a second layer 321 of polysilicon, and FIG. 7M shows the step of gate polysilicon formation with a photo resist pattern 322 on the polysilicon layer 321. The second polysilicon layer 321 is used to extend the polysilicon gate to the field isolation region and will be merged with the first polysilicon layer 304 on the active region.

Figure 7N:
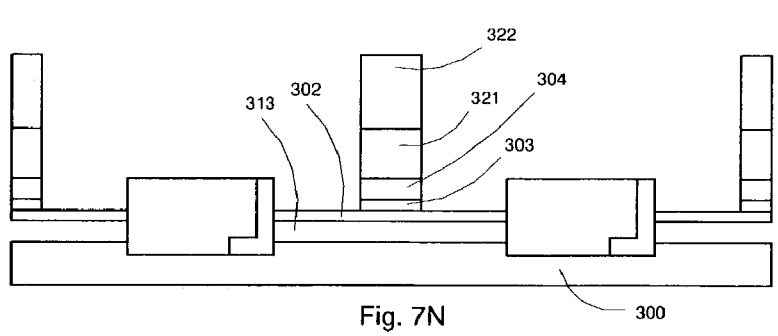
Figure 7O:
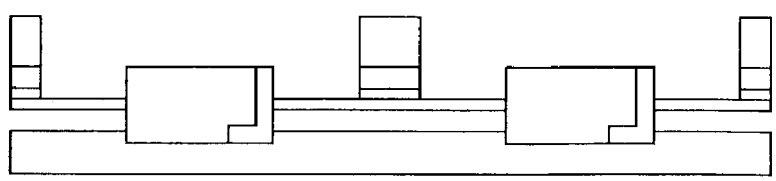

FIG. 7N shows the gate polysilicon formation through the etching of the polysilicon layer 321, using the photo resist 322 as a mask. The gate formation etches through the first polysilicon layer 304, through the gate oxide 303 and stops on the silicon layer 302. The photo resist 322 is stripped in FIG. 7O.

After the gate polysilicon formation, the device can be completed by state of the art CMOS process technology as shown in FIG. 7P. The SON device is isolated by the trench isolation 306 with the remnant of the anchor 312, and completely floated on the air gap 313. The polysilicon gate 321 may be implanted with doping impurities to increase the conductivity. A source region 342 and a drain region 341 are formed by the implantation of doping impurities, either n+ or p+, as is well known in the art. Lightly doped drain/source (LDD) regions and HALO may also be formed, prior to, or in conjunction with, the formation of source 342 and drain 341 regions. The source 342 and drain 341 regions of the present invention SON device are also isolated from the silicon substrate 300 by the air gap 313. Gate spacer 349 may be fabricated to isolate the gate structure 321 and 304. The transistor structure may be either an n-channel or a p-channel device. Metallization then follows to complete the device fabrication. An oxide layer 344 covers the structure, and then contact holes are etched for metallization interconnection. Metal is then deposited to form source electrode 346, drain electrode 347, and gate electrode 345. Silicidation of the source, drain and polysilicon gate may also be applied.

Further, the source and drain regions of the silicon-on-nothing device can be raised source and drain regions in which the source and drain regions may be enlarged by a raised source and drain technology to reduce the transistor's series resistance. A process of raise source and drain can be found in Hsu et al., U.S. Pat. No. 6,368,960, entitled "Double sidewall raised silicided source/drain CMOS transistor", and Sakiyama et al., U.S. Pat. No. 6,352,899, entitled "Raised silicide source/drain MOS transistors having enlarged source/contact regions and method", hereby incorporated by reference.

The above process sequence is applicable for devices having a polysilicon gate. The present invention silicon-on-nothing device fabrication is also applicable to devices having a metal gate in which the gate material is metal such as copper, aluminum, tungsten, nickel, titanium, tantalum, platinum, or any alloy combinations thereof. A metal gate CMOS process may be adapted to employ the isolated floating silicon active area to fabricate device having metal gate electrode. A process to make metal gate MOS transistor can be found in Hsu et al., U.S. Pat. No. 6,274,421, entitled "Method of making metal gate sub-micron MOS transistor", hereby incorporated by reference.

In a variation of the above process sequence, a partial etch of the silicon germanium layer 301 may be accomplished before the deposition of the anchor layer. After the trench isolation formation as shown in FIG. 7D, a selective silicon germanium etch can be performed. FIG. 7D1 shows the additional step after FIG. 7D in which the silicon germanium etch step creates a recess 340, leaving a section of the remaining silicon germanium to prevent the lifting of the silicon active area. The process is then continued with the deposition of the anchor layer 310 as shown in FIG. 7E. Since the anchor layer is preferably not filling the gap in the silicon germanium etch section, the technique of plasma enhanced chemical vapor deposition of the anchor layer is preferred to prevent filling of this gap.

Furthermore, in a variation of the above process sequence, a thermal oxidation step can be inserted after the selective silicon germanium layer 301. The air gap maybe partially or fully filled with thermally grown silicon dioxide due to this thermal oxidation step. The thermally grown silicon dioxide on the bottom surface of the silicon active layer 302 may improve the device performance.

What is claimed is:

1. A method for fabricating an isolated floating active area on a semiconductor substrate, the method comprising the steps of:
   a) forming a multilayer structure on a semiconductor substrate, the multilayer structure comprising a sacrificial layer;
   b) forming an active area overlying the sacrificial layer, surrounded by an isolation trench having a depth at or below the sacrificial layer;
   c) forming an L-shaped anchor from an insulating material, anchoring the active area to the semiconductor substrate;
   d) selectively etching the sacrificial layer, fully isolating the active area from the semiconductor substrate; and
   e) filling and planarizing the selectively etched sacrificial layer.

2. A method for fabricating an isolated floating silicon active area on a silicon substrate, the method comprising the steps of:
   a) forming a multilayer structure on the silicon substrate, the multilayer structure comprising a silicon germanium layer and a silicon layer;
   b) forming a silicon active area from the silicon layer, surrounded by an isolation trench having a depth at or below the silicon germanium layer;
   c) forming an L-shaped anchor for anchoring the silicon active layer to the silicon substrate;
   d) selectively etching the silicon germanium layer, fully isolating the silicon active area from the silicon substrate; and
   f) after step d), filling and planarizing the isolation trench.

3. The method as in claim 2 wherein the silicon germanium layer is formed by epitaxial deposition.

4. The method as in claim 2 wherein the silicon layer is formed by epitaxial deposition.

5. The method as in claim 2 wherein selectively etching the silicon germanium layer includes creating an air gap between the silicon active area and the silicon substrate.

6. The method as in claim 5 further comprising a step e) after step d):
   e) oxidizing the silicon surfaces exposed after the selective etching of the silicon germanium layer, the oxidation partially or fully filling the air gap created by the selective etching of the silicon germanium layer.

7. A method for fabricating a silicon-on-nothing device from an isolated floating silicon active area on a silicon substrate, the method comprising the steps of:
   a) forming a multilayer structure on a silicon substrate, the multilayer structure comprising an epitaxial silicon germanium layer, an epitaxial silicon layer, a gate dielectric layer, and a cap layer;

b) forming a silicon active area from the silicon layer, surrounded by an isolation trench having a depth at or below the silicon germanium layer;

c) forming an L-shaped anchor for anchoring the silicon active layer to the silicon substrate;

d) selectively etching the silicon germanium layer, fully isolating the silicon active area from the silicon substrate;

e) filling and planarizing the isolation trench; and f) forming gate, source and drain regions in the isolated silicon active area.

8. The method as in claim 7 wherein the thickness of the silicon germanium layer is between 3 nm and 50 nm.

9. The method as in claim 7 wherein the germanium content of the silicon germanium layer is between 20 to 60 atomic percent.

10. The method as in claim 7 wherein the thickness of the silicon layer is between 3 nm and 100 nm.

11. The method as in claim 7 wherein forming the silicon active area surrounded by an isolation trench comprises defining an isolation trench surrounding the silicon active area by photolithography; and etching the areas not protected by the photolithography defined structure.

12. The method as in claim 11 wherein the trench isolation etching is accomplished by reactive ion etching.

13. The method as in claim 7 wherein the isolation trench depth is between 5 nm to 50 nm below the silicon germanium layer.

14. The method as in claim 7 wherein forming the L-shaped anchor comprises:

depositing an anchor layer;

defining an L-shaped anchor structure by photolithography; and etching the areas not protected by the photolithography defined structure.

15. The method as in claim 7 wherein the silicon germanium layer etching is accomplished by a wet etch process.

16. The method as in claim 7 wherein the silicon germanium layer etching is accomplished by a reactive ion etching process.

17. The method as in claim 7 wherein selectively etching the silicon germanium layer includes forming an air gap between the silicon active area and the silicon substrate.

18. The method as in claim 17 further comprising a step d1) after step d): d1) oxidizing the silicon surfaces exposed after the selective etching of the silicon germanium layer, the oxidation partially or fully filling the air gap created by the selective etching of the silicon germanium layer.

19. The method as in claim 7 wherein the source and drain regions of the silicon-on-nothing device are raised source and drain regions.

20. The method as in claim 7 wherein the silicon-on-nothing device has a polysilicon gate.

21. The method as in claim 7 wherein the silicon-on-nothing device has a metal gate.

* * * * *